United States Patent
Carter et al.

(10) Patent No.: US 10,269,540 B1
(45) Date of Patent: Apr. 23, 2019

(54) IMPEDANCE MATCHING SYSTEM AND METHOD OF OPERATING THE SAME

(71) Applicant: Advanced Energy Industries, Inc., Fort Collins, CO (US)

(72) Inventors: Daniel Carter, Fort Collins, CO (US); Victor Brouk, Fort Collins, CO (US)

(73) Assignee: Advanced Energy Industries, Inc., Fort Collins, CO (US)

( * ) Notice: Subject to any disclaimer, the term of this patent is extended or adjusted under 35 U.S.C. 154(b) by 0 days.

(21) Appl. No.: 15/879,868

(22) Filed: Jan. 25, 2018

(51) Int. Cl.
*H03H 11/28* (2006.01)
*H01J 37/32* (2006.01)

(52) U.S. Cl.
CPC ....... *H01J 37/32183* (2013.01); *H03H 11/28* (2013.01); *H01J 2237/3321* (2013.01)

(58) Field of Classification Search
CPC .......... H01J 37/32; H01J 37/32009; H01J 37/32036; H01J 37/32082; H01J 37/32091; H01J 37/321; H01J 37/32183; H01J 2237/3321; H03H 11/28; H03H 11/30; H03H 7/38; H03H 7/40; H03H 2007/386; H03H 9/0004; H03H 17/0045; H01L 21/3065; H01L 21/67063; H01L 21/02271–21/0228; H01L 21/02266
USPC ........................................ 315/111.01–111.91
See application file for complete search history.

(56) References Cited

U.S. PATENT DOCUMENTS

| | | | | |
|---|---|---|---|---|
| 7,527,016 | B2* | 5/2009 | Yamazawa | H01J 37/321 118/723 E |
| 2012/0038277 | A1* | 2/2012 | Eto | H01J 37/32091 315/111.21 |
| 2013/0214828 | A1* | 8/2013 | Valcore, Jr. | H01J 37/32146 327/141 |
| 2017/0099723 | A1* | 4/2017 | Nagami | H01J 37/32091 |
| 2017/0345621 | A1* | 11/2017 | Cheng | H01J 37/32 |

* cited by examiner

*Primary Examiner* — Tung X Le
*Assistant Examiner* — Henry Luong
(74) *Attorney, Agent, or Firm* — Polsinelli PC

(57) ABSTRACT

An impedance matching system includes an impedance matching network coupled between an alternating current (AC) generator and electrodes of a plasma chamber. The AC generator is configured to generate a multi-level pulse signal of cyclically recurring pulse intervals with differing amplitude levels. A controller or other device identifies each recurring pulse interval, and for each pulse interval, determines an impedance mis-match level between the AC generator and the electrodes, adjusts a configuration of the impedance matching network according to the determined impedance mis-match level, and stores information associated with the adjusted configuration. When an ensuing pulse interval occurs, the controller obtains the stored information from memory, adjusts the configuration of the impedance matching network according to the stored information, determines another impedance mis-match level between the AC generator and the electrodes, and adjusts the configuration of the impedance matching network to iteratively reduce the impedance mismatch level.

18 Claims, 8 Drawing Sheets

US 10,269,540 B1

IMPEDANCE MATCHING SYSTEM AND METHOD OF OPERATING THE SAME

TECHNICAL FIELD

Aspects of the present disclosure relate to amplifiers and, in particular, to a impedance matching system and method of operating the same.

BACKGROUND

In the field of semiconductor manufacturing, as well as other fields, a plasma chamber has various possible uses. For example, plasma-enhanced chemical vapor deposition (CVD) is a process used to deposit thin films on a substrate using a plasma chamber. In high level terms, a radio frequency (RF) power supply generates a plasma from reacting gases within the chamber, and from which the deposition occurs on a substrate within the chamber. In order to achieve efficient power transfer between an RF generator and the plasma load, an impedance-matching network is often used to match the load impedance (including the impedance of the plasma) to the output impedance of the power supply. The load impedance is typically around 50 Ohms but it varies. For example, plasma load impedance may vary depending on variables such as generator frequency, power, chamber pressure, gas composition, and plasma ignition. The match network accounts for these variations in load impedance by varying electrical elements, typically vacuum variable capacitors, to match the varying load impedance to the generator's output impedance.

Recent developments in plasma generating techniques have involved multi-level pulsing of the RF energy that tailors or otherwise customizes the plasma characteristics, as one example, time-dependent behaviors, in the plasma chamber. In general, multi-level pulse generally involves cyclic adjustment of the intensity level of RF energy inputted into the plasma chamber using two or more amplitude levels of the RF generator such that an optimum profile of the ions and free radicals both in the bulk of the plasma and those arriving to the surface of a substrate may be provided over a desired period of time. Using multi-level pulse plasma generating techniques, enhanced etch and CVD results can be realized, among other various benefits.

SUMMARY

According to one embodiment, an impedance matching system includes an impedance matching network coupled between an alternating current (AC) generator and one or more electrodes of a plasma chamber. The AC generator is configured to generate a multi-level pulse signal comprising a plurality of cyclically recurring pulse intervals with differing amplitude levels. The system also includes a controller to identify each of the recurring pulse intervals, and for each pulse interval, determine an impedance mis-match level between the AC generator and the one or more electrodes, adjust a configuration of the impedance matching network according to the determined impedance mis-match level, and store information associated with the adjusted configuration in a memory. When an ensuing pulse interval occurs, the controller obtains the stored information from the memory, adjusts the configuration of the impedance matching network according to the stored information, determines another impedance mis-match level between the AC generator and the electrodes, and adjusts the configuration of the impedance matching network to iteratively reduce the impedance mismatch level.

BRIEF DESCRIPTION OF THE DRAWINGS

The various features and advantages of the technology of the present disclosure will be apparent from the following description of particular embodiments of those technologies, as illustrated in the accompanying drawings. It should be noted that the drawings are not necessarily to scale; however the emphasis instead is being placed on illustrating the principles of the technological concepts. Also, in the drawings the like reference characters may refer to the same components throughout the different views. The drawings depict only typical embodiments of the present disclosure and, therefore, are not to be considered limiting in scope.

DETAILED DESCRIPTION

Figure 1A:
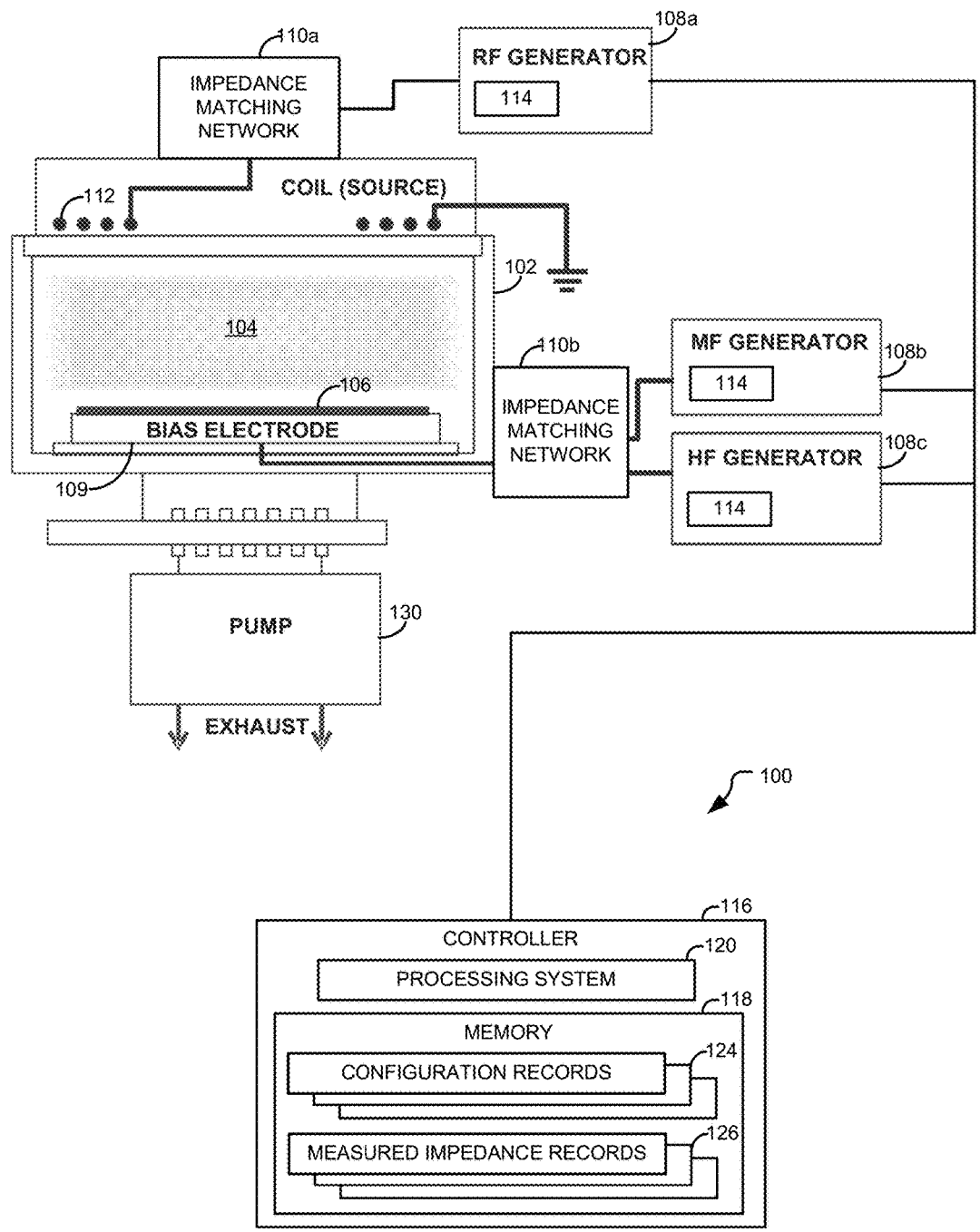
FIG. 1A illustrates a first example impedance matching system that may be used match an impedance level of one or more multi-level pulse signals generated by one or more alternating current (AC) generators (e.g., RF, MF and HF) of a plasma chamber according to one embodiment of the present disclosure.

Embodiments of the present disclosure provide an impedance matching system for a plasma chamber. The system generates a multi-level pulse signal to at least one electrode within the chamber to ignite and sustain a plasma, and iteratively matches the impedance of the plasma load of each pulse interval to a desired impedance value, which is typically the output impedance of the AC generator. Plasma generating techniques using multi-level pulse signals provide improved customization of plasma energy levels in a plasma chamber in comparison with continuous wave plasma processing. Precise impedance matching of each pulse interval with the plasma load, however, is challenging. Embodiments of the present disclosure provide such impedance matching, among other advantages, by identifying the individual pulse intervals of a multi-level pulse signal, and for each pulse interval, obtaining a configuration of an electronically switched impedance matching network (e.g., a combination of switched elements to provide the desired impedance) generated for that pulse at a previous interval, and configures the impedance matching network with the obtained combination of switch elements. During the pulse interval, the system measures a current impedance mis-match level, and iteratively adjusts a configuration of the impedance matching network to reduce the impedance mis-match level, and stores the iteratively adjusted configuration in a memory for use in setting the impedance matching network in subsequent intervals.

In general, multi-level pulsing involves cyclic adjustment of the intensity level of RF energy used to generate the plasma. In one possible example, a power supply, referred to herein as an RF generator, produces an alternating current power in the RF range, which will include two or more amplitude levels of the RF energy (the multi-level pulses) to produce a plasma and associated processing environment in the chamber with a desired mix of radicals, neutrals, charged species, etc. In general, impedance matching is the practice of designing the input impedance of an electrical load or the output impedance of its corresponding signal source to maximize the power transfer to the load and/or minimize signal reflection from the load, as well as other possible advantages. In a pulsed RF energy environment, impedance matching is uniquely challenging because the variations in the load impedance driven by the changing characteristics of the plasma and chamber environment brought on by the differing pulse levels.

Pulsed (e.g., modulated) AC power plasma generation brings many advantages to otherwise conventional, continuous wave (CW) plasma processing. Pulsed power delivery is already demonstrated to provide numerous unique processing capabilities including tailoring ion to radical mix ratios and reducing flux of high energy, charged species to delicate substrates. Multi-level pulsing offers additional advantages over conventional pulsing (e.g., on-to-off) in that an "off" condition is not necessarily required and the plasma is allowed to remain in an energized state (by pulsing from a low power to a high power condition, for instance) throughout the processing run thus providing enhanced stability by, among other things, eliminating re-ignition from an off condition. Further advantages of multi-level pulsing may also include finer tuning of species mix ratios and more effective control of the content and energy of charged species.

As already mentioned, one of the challenges to any pulsed power application is impedance matching. Pulsing power to a plasma creates a very dynamic environment where the load impedance experienced by the power generator can be highly transient due to the response of the plasma to the modulating power. Multi-level pulsing modifies this situation in that the plasma may not fully decay in the "off" or "low" state condition, but nonetheless still experiences potentially dramatic swings in density and the resulting impedance represented to the power generator.

In multi-level pulsing, the possibility exists to produce not only two unique plasma states ("high" and "low") but theoretically a range of states, each representing a unique and potentially desirable mix of radicals, neutrals, charged species, etc. Since each state could represent a unique plasma impedance condition, the ability to efficiently deliver power to each condition may be compromised if the matching circuitry is not adequately agile to tune to each of the unique states. Conventional impedance matching techniques for pulsed power operation have included filtering methods or synchronized measurement techniques to compensate for the generally slow, mechanically-driven variable capacitors of an impedance matching system, thus allowing them to reach a generally "tuned" solution for a time-averaged "on" condition.

In many cases, the multi-level pulse signal includes two or more recurring pulse intervals each lasting approximately 50.0 milliseconds or more. Conventional impedance matching networks have been developed to iteratively adjust the impedance match level between the generator and the plasma chamber, but these conventional impedance matching networks typically require over 1 second to adjust the impedance in mechanical designs, and over 200 milliseconds to adjust the impedance for electronically switched designs. Thus, because of the significant time difference between the pulse intervals and associated plasma changes, and the longer times for conventional matching, effective impedance matching for multi-level pulse plasma power signals has remained elusive.

Figure 1B:
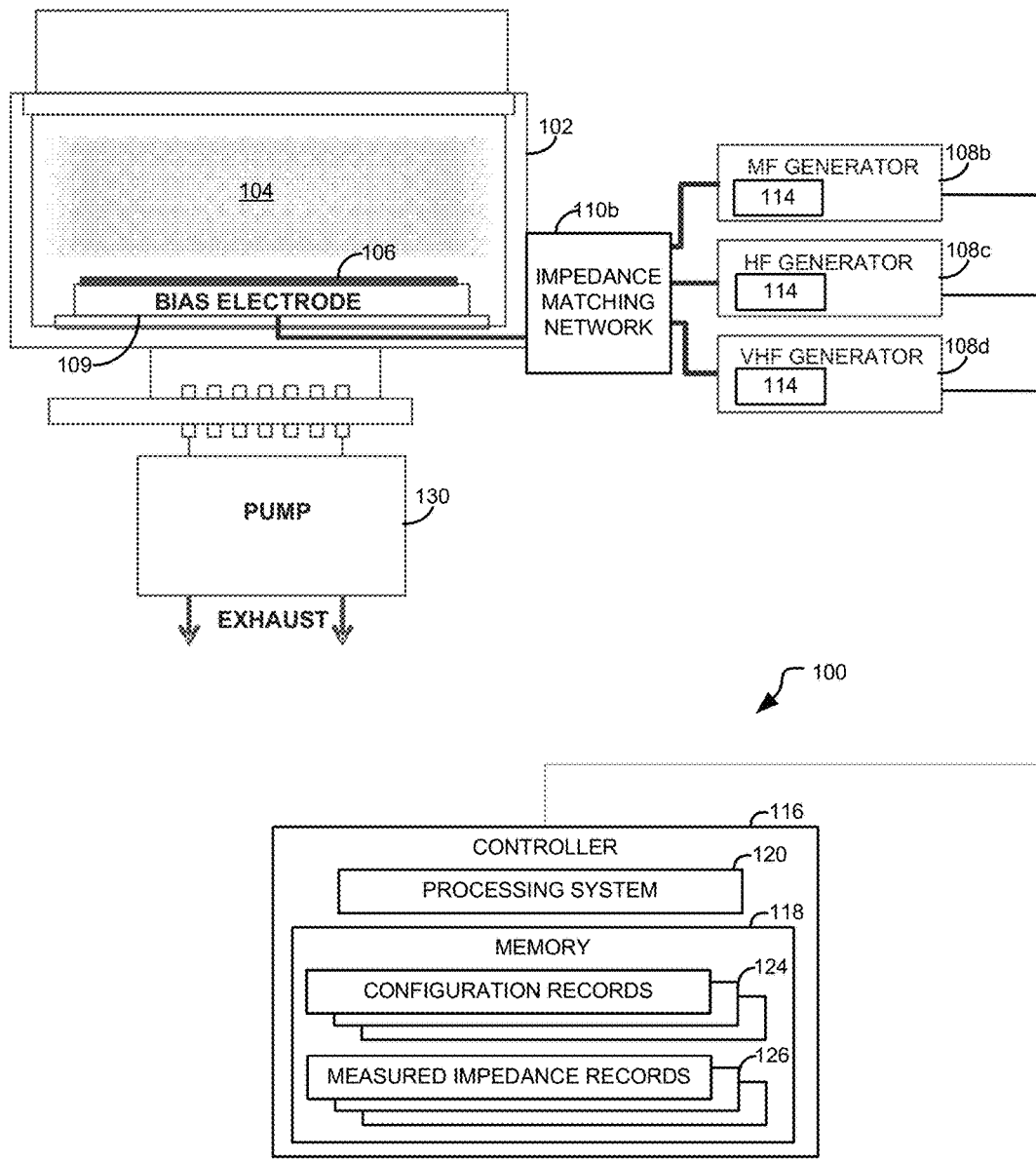
FIG. 1B illustrates a second example impedance matching system that may be used match an impedance level of one or more multi-level pulse signals generated by one or more alternating current (AC) generators (e.g., MF, HF and VHF) of a plasma chamber according to one embodiment of the present disclosure.

FIGS. 1A and 1B illustrate examples of a plasma chamber 102 operated with an impedance matching system 100, in combination with other components discuss herein, to generate and control a plasma 104 within the plasma chamber according to one embodiment of the present disclosure. The plasma chamber 102 includes an enclosure in which the plasma 104 is generated and contained. Also within the chamber is a wafer 106 or other substrate onto which atoms and other particles from the plasma are deposited. While discussed in the context of deposition, the systems discussed herein may be used with other processes including etch. One or more generators are coupled to electrodes within the chamber to generate a field between the electrodes to ignite and control the plasma. An impedance matching network 110 is positioned between the generator or generators and the electrodes. The plasma system also includes one or more sensors 114 for measuring an impedance mis-match level. The sensors are illustrated as being integrated within the power supplies but may also be at other locations in a power delivery path between the power supply and chamber. The power delivery path includes the generator itself along with the cable, match network, and conduct feed to the chamber electrodes. The plasma chamber 102 may also include a pump 130 that creates a vacuum within the plasma chamber, and which may also evacuate material from the chamber. In a CVD process, for example, the wafer 106 is placed within the plasma chamber 102, and an electro-magnetic field is generated within the chamber by the RF generators 108 to excite a gas within the chamber to form the plasma 104. The plasma can be considered an unstable load, particularly when driven by a multi-level pulses as discussed herein, and thus requires precise control of the energy of the field generated within the chamber to control the plasma. The plasma chamber 102 may also include a bias electrode 109 for coupling to any one of the impedance matching networks 110.

The plasma chamber 102 may be any type that is capable of generating a plasma. In the first example (FIG. 1A), the illustrated plasma chamber 102 includes an RF generator 108a driving a top electrode, or coil in this case, primarily to generate the bulk of the plasma 104 (plasma source), and a mid-frequency (MF) generator 108b (e.g., 100 kHz-2 MHz), and a high frequency (HF) generator 108c (e.g., 2 MHz-27 MHz), driving the bias electrode primarily to deliver controllable voltage to the surface of the wafer 106. The plasma source contributes strongly to the composition of charged species (ions and electrons) as well as radicals and neutral reactive species present in the bulk of the chamber volume. The MF and HF power fed to the bias electrode contribute to these as well but their primary purpose is to control surface potential on the wafer (106). In alternate embodiments the example chamber 102 could be configured with a microwave or ECR (electron-cyclotron resonant) plasma source (or other) in place of the RF generator driven plasma source.

In a second example (FIG. 1B), the illustrated plasma chamber lacks the RF generator and associated matching network and top electrodes. In this example, a very high frequency (VHF) generator 108d (e.g., greater than 27 MHz) is used to generate the plasma bulk 104 by coupling VHF energy to the bias electrode. Combined on the bias electrode are a mid-frequency (MF) generator 108b (e.g., 100 kHz-2 MHz), and a high frequency (HF) generator 108c (e.g., 2 MHz-27 MHz). In this case the bulk plasma density is produced primarily by the VHF energy imparted by the VHF generator. And similar to FIG. 1A, the MF and HF energy from the MF and HF generators respectively deliver controllable voltage on the surface of the wafer 106. The VHF energy in this example contributes strongly to the composition of charged species (ions and electrons) as well as radicals and neutral reactive species present in the bulk of the chamber volume.

Manipulation of power to each electrode during processing affects the composition, density, and energy of the species present in the plasma. Pulse modulation of power to any or all of the electrodes, as stated above, offers further ability to control or modify plasma parameters to achieve desired process behaviors. The RF, MF, HF and VHF designations are used to generally refer to frequency differences between the various signals and not intended to be limiting. Depending on the context and a broad sense, the various recited frequency bands may be considered to fall within a radio frequency spectrum, and hence the specification may collectively refer to the various generators as RF generators. Generally speaking, in both FIGS. 1A and 1B, the system includes both an HF generator and a MF generator, and in general terms higher frequencies contribute greater to plasma density generation. So, for example, in a chamber as shown in FIG. 1B, without a top mounted electrode serving as the "plasma source," VHF may be added to the bias electrode to act as the primary source of plasma formation. Other embodiments are of course possible; for instance, HF or VHF generators may be applied to a top electrode, and an HF and MF generator or only an MF generator coupled with the bias electrode. The lower frequencies to the bias electrode are used to impart a surface potential on the wafer surface to draw ions (or electrons) to the wafer. The potential generated on the surface determines the energy of the arriving ions and thus in both configurations there is some level of independent control over plasma formation and energy of ions arriving to the surface. The examples generator configurations shown in FIGS. 1A and 1B are typical but other arrangements are possible.

It should be appreciated that the principles of the present disclosure may be applied to plasma chambers having any type and quantity of RF generators. In the system illustrated, a first matching network 110a is provided for matching the impedance of the RF generator 108a with the plasma load, and a second matching network 110b is provided for matching the impedance of the RF generators 108B-108d with the plasma load. According to embodiments of the present disclosure, the impedance matching system 100 includes a controller 116 that controls a configuration of any one of the impedance matching networks 110 to iteratively adjust an impedance matching level between at least one of the generators 108 and the plasma load. Control may be achieved by obtaining an impedance matching network configuration record 124 from a memory 118. The impedance matching network configuration record 124 represents a configuration of the impedance matching network 110 created at a previous pulse interval, and which record 124 is used to adjust the configuration of the impedance matching network 110. Next, the system measures a current impedance mis-match level, and iteratively adjusts a configuration of the impedance matching network to reduce the impedance mis-match level for future pulse intervals. That is, the adjusted configuration may then be stored in the memory, or used to simply revise the record for the pulse, so that the adjusted configuration may be used for ensuing pulse intervals. In general, impedance matching is the practice of designing the input impedance of an electrical load or the output impedance of its corresponding signal source to maximize the power transfer or minimize signal reflection from the load.

The controller 116 is used to control the operation of the impedance matching networks 110, and more particularly to dynamically configure a collection of elements to match the input impedance of the power supply to the plasma load. The controller 116 includes a processing system 120 that may include one or more processors that execute instructions stored in a memory (e.g., computer readable media) 118 to control the operation of the impedance matching networks 110. In other embodiments, it is contemplated that the controller 116 may be embodied in other specific forms, such as using discrete and/or integrated analog circuitry, field programmable gate arrays (FPGAs), application specific integrated circuitry (ASICs), or any combination thereof. Although the controller 116 is shown being separate from the other elements of the system 100, it should be appreciated that the controller 116 may be configured in any one or a combination of the generators 108, and/or the impedance matching networks 110.

The one or more processors may process machine/computer-readable executable instructions and data, and the memory 118 may store machine/computer-readable executable instructions. A processor is hardware and memory is hardware. The memory 118 configured in the controller 116 may include random access memory (RAM) and/or other non-transitory memory, e.g., a non-transitory computer-readable medium such as one or more flash disks or hard drives. The non-transitory memory may include any tangible computer-readable medium including, for example, magnetic and/or optical disks, flash drives, and the like. The memory 118 stores impedance matching network configuration records 124, which may include records for each pulse interval generated by the generators 108, and measured impedance level records 126 representing one or more measured impedance values measured for each pulse interval. The operation of the system, including the function and purpose of the impedance matching network configuration records 124 and measured impedance level records 126, will be described in detail herein below.

Figure 2A:
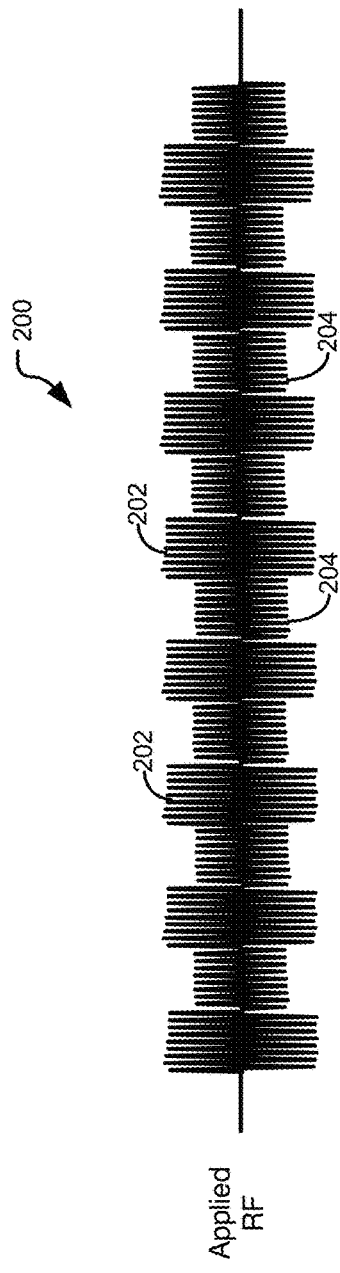
FIGS. 2A and 2B illustrate example multi-level pulse signals that may be generated by either of the RF generator, the mid frequency (MF) generator, the high frequency (HF) generator, or the very high frequency (VHF) generator of FIG. 1A according to one embodiment of the present disclosure.
Figure 2B:
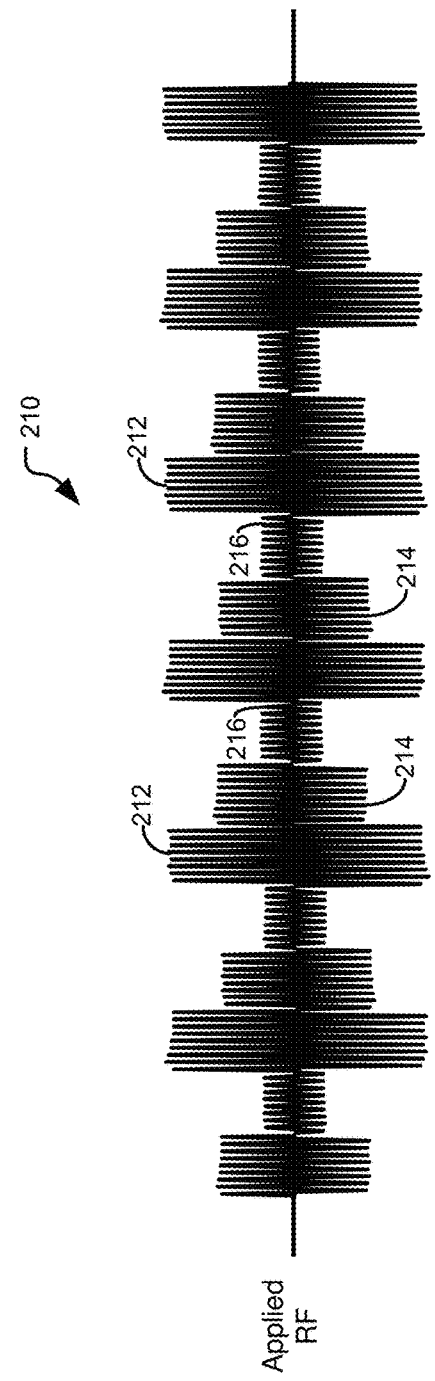

FIGS. 2A and 2B illustrate example multi-level pulse signals 200 and 210 emitted from any one or a combination of the RF power generators 108. In general, the multi-level pulse signal 200 of FIG. 2A includes two recurring pulse intervals 202 and 204 with each interval having an RF frequency and different amplitudes, while the multi-level pulse signal 210 of FIG. 2B includes three recurring pulse intervals 212, 214, and 216, with each of the three pulses having different amplitudes. Although, only multi-level pulse signals having two and three pulse intervals are shown and each discrete interval as well as the sequence of pulse intervals occurring at repeating periods, it should be understood that embodiments of the present disclosure may extend to other pulse arrangements and be applied to other multi-level pulse signals having more than three recurring pulse intervals, different amplitudes, periods or combinations of amplitudes occurring at different intervals or periods, or the like. A system may have various possible combinations of such multi-pulse signals, and the set shown and discussed is simply illustrative.

The amplitude of each pulse interval 202 and 204 or 212, 214 and 216 may be controlled in any suitable manner. For example, the generator 108 may be controlled to adjust the output amplitude of the multi-level pulse signal in a cyclic recurring fashion. Further, the system may adjust each pulse duration and corresponding amplitude. For example, the generator 108 may include a gating circuit to limit the output of the generator 108 to a particular amplitude level. As another example, the generator 108 may include a controller that manipulates a feedback loop of the generator 108 to control its output amplitude.

Due to changes in the plasma caused by the discrete pulses of either of the multi-level pulse signals 200 and 210, the impedance level exhibited inside the plasma chamber 102 may change. For example, the impedance of the plasma 104 may decrease when the plasma level increases as a result of an increased amplitude of the power, and increase when the plasma level decreases as a result of reduced amplitude of the power. Additionally, the transient nature of the plasma level may be affected by how fast the pulse intervals are changed. Thus, managing the impedance matching levels may be a relatively difficult endeavor. Embodiments of the present disclosure provide a solution to these challenges by iteratively adjusting the configuration of the impedance matching network 110 of each pulse interval 202, 204, 212, 214, and 216 so that impedance level matching may be optimally obtained.

In general, the controller 116 controls the impedance matching network 110 to compensate for changes in the impedance of the plasma 104 by iteratively adjusting a configuration of the impedance matching network 110 during each pulse interval. The configuration may be iteratively adjusted by obtaining an impedance matching network configuration record 124 from a memory 118, which record includes a representation of a configuration of the impedance matching network 110 created at a previous pulse interval, use the record 124 to adjust the configuration of the impedance matching network 110, measure a current impedance mis-match level, and adjust the configuration of the impedance matching network to reduce the impedance mis-match level for future pulse intervals by storing a new record for the next pulse. It is also possible that the impedance matching network may be further adjusted during the pulse to account for the detected mismatch and reduce the level of mismatch. The controller 116 identifies the various pulse intervals of the multi-level pulse signal 200 or 210, and synchronizes its operation with the multi-level pulse signal so that the impedance from the matching network during each pulse interval may be iteratively matched to the impedance of the plasma. The system 100 tunes the impedance matching network 110 using an electronically switched matching technique. The electronically switched match circuit possesses the ability to accurately tune to each power level considered for multi-level pulse operation. Further, with properly designed control electronics, the matching circuit has the ability to switch from one matching state to the next quickly (e.g., in a micro-second or less), thereby allowing the matching elements to be synchronously and accurately positioned from one pulse interval to the next. Using this approach, there are numerous unique tuning positions, and so a multi-level pulse process could be designed and properly operated with a multitude of pulse-power levels.

When the wafer 106 is positioned inside of a plasma chamber 102, and a gas introduced into the plasma chamber 102, at least one of the AC generators 108 generates a multi-level pulse amplitude signal, such as the multi-level pulse signal 200 or 210, that ignites a plasma in the chamber. While in operation, the controller 116 identifies each of the recurring pulse intervals of the multi-level pulse signal, and for each pulse interval, obtains a configuration record 124 of the impedance matching network 110 for the current pulse interval, and sets the impedance matching network 110 to the configuration record 124 stored for that pulse interval. The controller 116 also continually measures an impedance mis-match level for each pulse, and subsequent pulses, to iteratively adjust the configuration of the impedance matching network 110 to compensate for the impedance mis-match level during operation of the plasma chamber. Impedance of the plasma may be measured using sensors located in the matching network(s) and/or the RF generator(s). Examples of suitable sensors may include voltage/current (V/I) sensors or directional couplers. In some cases, the impedance mis-match level may be determined by measuring a forward energy level and a reflected energy level, and dividing the reflected energy level by the forward energy level to determine the impedance mis-match level magnitude along with phase information associated with the forward energy and the reflected energy.

Figure 3:
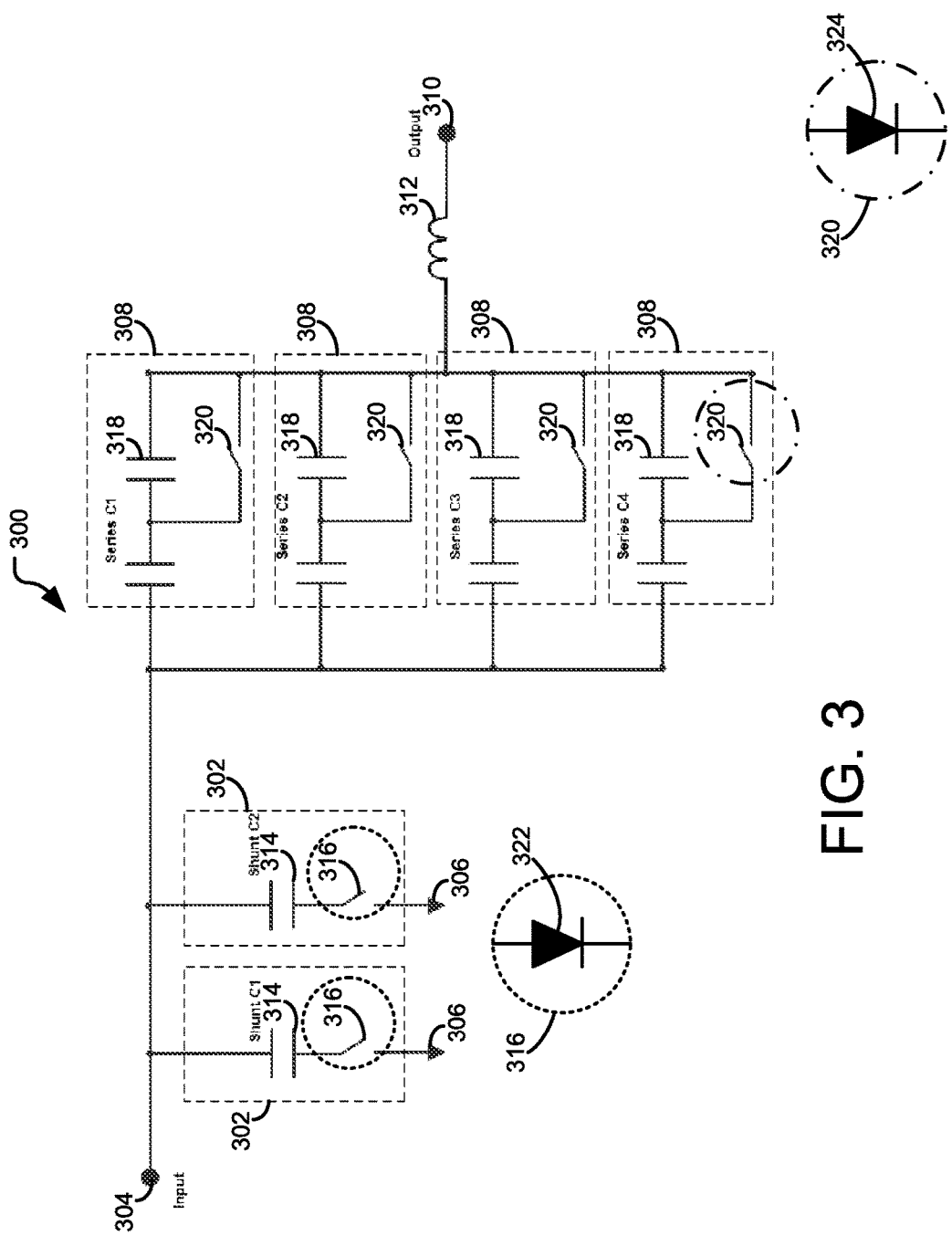
FIG. 3 illustrates an example impedance matching network that may be implemented for use by the impedance matching system according to one embodiment of the present disclosure.

FIG. 3 illustrates an example impedance matching circuit portion 300, of the impedance matching network 110, which may be implemented for use by the impedance matching system 100 according to one embodiment of the present disclosure. The example impedance matching circuit portion 300 includes one or more shunt circuits 302 coupled between an input 304 and a ground node 306, and one or more series circuits 308 coupled between the input 304 and an output 310. The input 304 is coupled to the AC generator 108, while the output 310 is coupled to one of the electrodes 112 in the plasma chamber. The impedance matching circuit portion 300 may also include an inductive strap 312 coupled between the series circuits 308 and the output 310. The two shunt circuits 302 are arranged in a parallel configuration with one another, while the four series circuits 308 are arranged in a parallel configuration with one another. Although, the impedance matching circuit portion 300 is shown having two shunt circuits 302 and four series circuits 308, it should be understood that other embodiments may include greater or fewer than two shunt circuits 302, and/or greater or fewer than four series circuits 308 without departing from the spirit and scope of the present disclosure.

Each shunt circuit 302 includes a capacitor 314 and a switch 316, while each series circuit 308 includes two capacitors 318 and a switch 320. The controller 116 may activate the switches 316 and 320 to place some combination of shunt capacitors 314 to ground, and some combination of series capacitors 318 between the input 304 and the output 310. Because the shunt circuits 302 are arranged in a parallel configuration, by selectively actuating each of the switches 316 of the shunt circuits 302, a cumulative capacitive coupling of the multi-level pulse signal introduced at the input 304 to the ground node 306 may be generated. In a likewise manner, because the series circuits 308 are arranged in a parallel configuration, by selectively actuating each of the switches 320 of the series circuits 308, a cumulative capacitive coupling of the multi-level pulse signal to the output 310 may be generated.

For example, if a capacitance value of a capacitor 314 of one shunt circuit 302 is 0.1 microfarad (uF) and a capacitance value of a capacitor 314 of the other shunt circuit 302 is 0.2 uF, then the cumulative capacitive coupling of the multi-level pulse signal to the ground node 306 may be adjusted to 0.1 uF, 0.2 uF, and 0.3 uF based upon how the switches 316 are independently actuated. Additionally, if a capacitance value of a capacitor 318 of one series circuit 308 is 0.1 uF, a capacitance value of a capacitor 318 of another series circuit 308 is 0.2 uF, a capacitance value of a capacitor 318 of another series circuit 308 is 0.4 uF, and a capacitance value of a capacitor 318 of another series circuit 308 is 0.8 uF, then the cumulative capacitive coupling of the multi-level pulse signal to the ground node 306 may be adjusted between 0.1 uF to 1.5 uF in 0.1 uF increments based upon how the switches 320 are independently actuated.

The presence of the capacitors 314 and 318 within the power delivery path presents them as a portion of the load impedance the generator experiences. Various combinations of capacitors, in parallel, serial or parallel and serial arrangements are possible to accommodate various possible impedance matching scenarios. Switching the capacitors 314 and 318 to be into or out of the delivery path results in a load impedance change that is then subject to a measurement of error based on actual measured load impedance and desired or target load impedance (e.g., typically 50 ohms and/or equal to the output impedance of the generator or other desired target impedance value). Thus, with proper measurement of the impedance and control of the impedance, the system may switch in or out various combinations of elements to reduce this error and transform the load impedance experienced by the generator to be equal to or adequately close to the output impedance of the generator. Accomplishing this reduces mismatch and lowers the reflection coefficient of the power delivered to the plasma.

In one embodiment, the switches 316 and 320 comprise positive intrinsic negative (PIN) diodes 320 and 324, respectively. PIN diodes 320 and 324 are diodes that include a relatively wide, undoped intrinsic semiconductor region between a p-type semiconductor and an n-type semiconductor region. The wide intrinsic region makes the PIN diode 320 and 324 suitable for attenuators, fast switches, photodetectors, and high voltage power electronics applications due its relatively low switching capacitance levels. Thus, the impedance matching circuit portion 300 configured with PIN diodes 320 and 324 possess relatively fast switching times and thus, may be well suited for turning the shunt circuits 302 and series circuits 308 on and off by the controller 116. The PIN diodes 320 and 324 do this in a relatively short timeframe, which would be beneficial when used with multi-level pulse signals that are often switched between pulse intervals in short durations.

Figure 4:
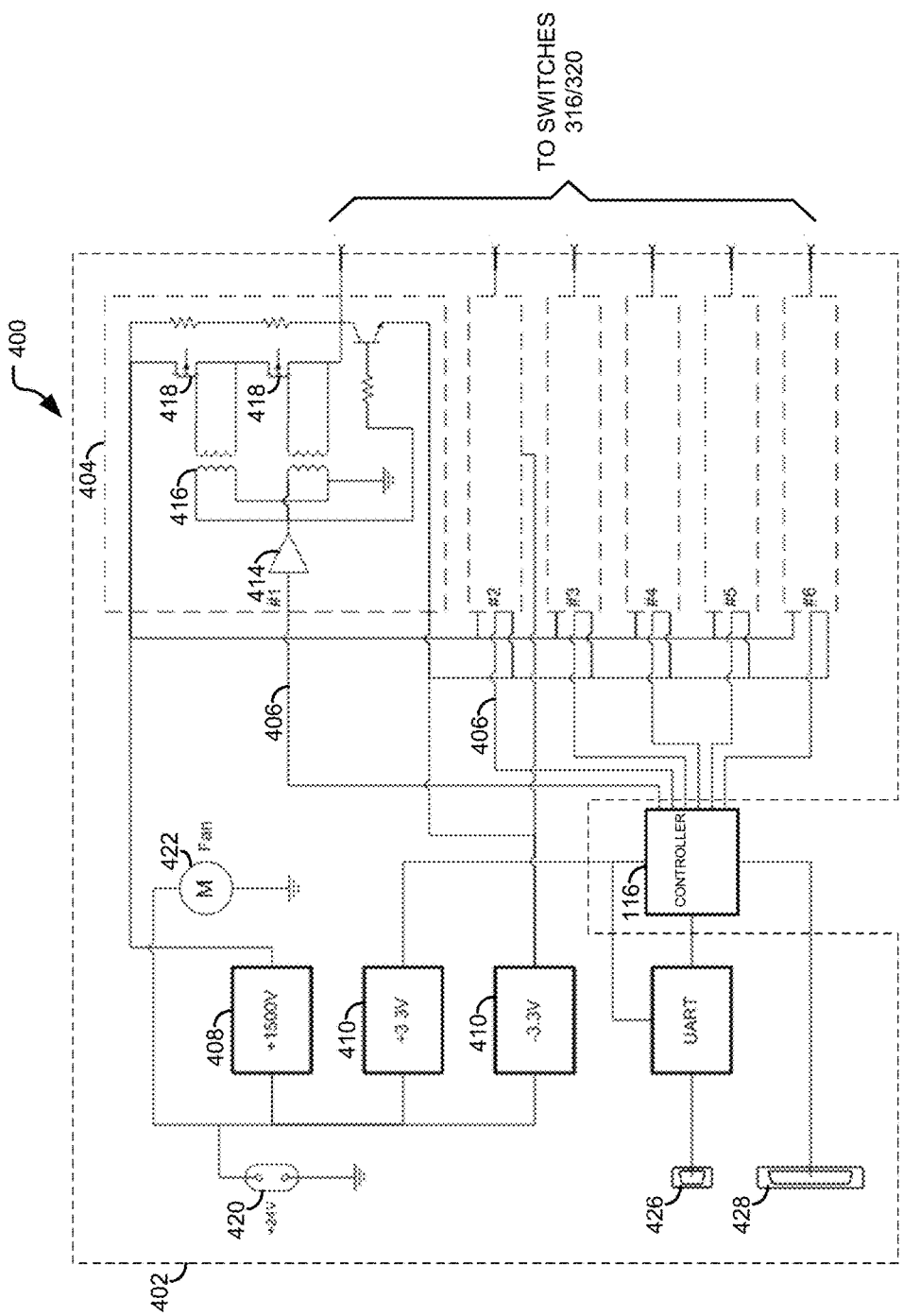
FIG. 4 illustrates an example controller and associated controller to impedance matching network interface circuit that may be used to control the operation of the impedance matching network according to one embodiment of the present disclosure.

FIG. 4 illustrates an example controller 116 and associated controller to impedance matching network interface circuit portion 402 of the impedance matching network 110 according to one embodiment of the present disclosure. In general, the interface circuit portion 402 includes multiple control signal shaping circuits 404 for each switch 316 and 320 included in the impedance matching circuit portion 300. Although, the interface circuit portion 402 is shown having six control signal shaping circuits 404, it should be understood that other embodiments may include greater than six control signal shaping circuits 404, or less than six control signal shaping circuits 404 without departing from the spirit and scope of the present disclosure.

Each control signal shaping circuit 404 receives a control signal 406 from the controller 116 to selectively apply electrical power from a high voltage source 408 that can be, for example, 1500 Volts or other suitable voltage level. Additionally, circuit supply voltage sources 410 are provided to provide a working voltage for the controller 116 and control signal shaping circuits 404. Each control signal shaping circuit 404 includes a buffer gate 414 that buffers the control signal 406 provided by the controller 116 to an isolation transformer 416. The isolation transformer 416 smoothes the control signal 406 that, among other things, normalizes the DC component of the control signal provided to the transistors 418, and/or removes spurious high frequency components of the control signal, and provides the smoothed control signal to the inputs of transistors 418. The isolation transformer 416 may be provided to the input of transistor 418 to safely remove the high voltage output of the high voltage source 408 when the input signal 406 is at a logic low level. Although the components of only one control signal shaping circuit 404 is shown for purposes of brevity and clarity of discussion, the other control signal shaping circuits 404 may include similar circuitry to that which is shown herein. The interface circuit portion 402 may also include a bias circuit 420 and a fan 422. The bias circuit 420 biases the high voltage source 408, and the circuit supply voltage sources 410 at a specified level, which in this particular example is approximately 24 Volts DC.

The control circuit used in the example controller 116 and associated controller to impedance matching network interface circuit portion 402 is part of a system designed for a relatively high RF power application. Thus, the bias voltage needed to control the function of a PIN diode must be adequately high to reduce the effects of the RF signal passing through the circuit. In high power applications, this RF voltage can be several hundred volts. In the exemplary circuit, a DC bias signal of 1500 volts may be implemented to ensure proper operation of the PIN diode switch. In lower power applications where RF voltages may be less, a bias control signal with a lower voltage may be adequate. In some examples illustrated herein, a PIN diode switch is employed; however, aspects of the disclosure may include other suitable switches, and related circuits and mechanisms.

The interface circuit portion 402 may also include an external computing system interface 426, such as a RS-232 signal interface, and/or a manual interface 428 to receive instructions for modifying the operation of the controller 116. Additionally, the computing system interface 426 may be used to receive a synchronizing signal representing the multi-level pulse signal 200 or 210 generated by the AC generator 108. For example, the synchronizing signal may be generated by the generator 108 to create a short pulse (e.g., approximately 2 micro-seconds) in duration whenever one pulse interval ends and an ensuing pulse interval begins so that the controller 116 may synchronize its operation with that of the AC generator 108.

Although FIGS. 3 and 4 illustrate examples of an impedance matching circuit portion 300 and controller to impedance matching network interface circuit portion 402 of the impedance matching network 110 that may be implemented with the impedance matching system 100, it should be understood that other embodiments of the impedance matching circuit portion 300 and controller to impedance matching network interface circuit portion 402 may be implemented without departing from the spirit and scope of the present disclosure. For example, the impedance matching circuit portion 300 could be implemented using any suitable matching network topology that matches the source impedance of the AC generator 108 with the load impedance of the electrode 112 in the plasma chamber 102.

Figure 5:
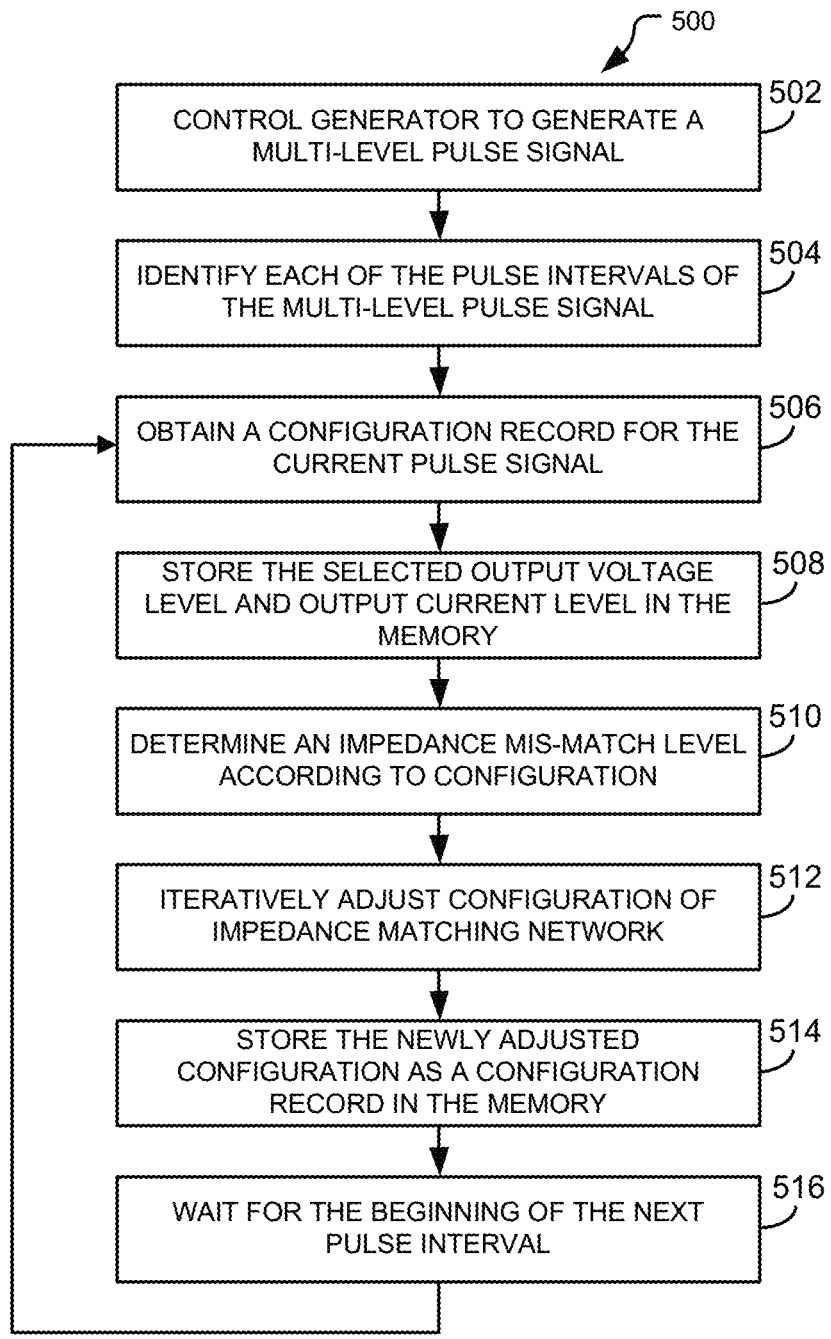
FIG. 5 illustrates an example process that may be performed by the controller to iteratively adjust the impedance levels for each pulse interval of a multi-level pulse signal implemented for use in a plasma chamber according to one embodiment of the present disclosure.

FIG. 5 illustrates an example process 500 that may be performed by the controller 116 to iteratively adjust the impedance levels for each pulse interval of a multi-level pulse signal 200 or 210 implemented for use in a plasma chamber 102 according to one embodiment of the present disclosure. Initially, a wafer 106 is positioned inside of a plasma chamber 102 followed by introduction of a plasma material into the plasma chamber 102.

At step 502, at least one of the AC generators 108 is managed to generate a multi-level pulse signal, such as the multi-level pulse signal 200 or 210 of FIG. 2A or the multi-level pulse signal 200 or 210 of FIG. 2B. In one embodiment, the multi-level pulse signal may be generated by either of the RF generator 108a, the mid frequency (MF) generator 108b, the high frequency (HF) generator 108c, or the very high frequency (VHF) generator 108d.

At step 504, the controller 116 identifies each of the recurring pulse intervals of the multi-level pulse signal. In one embodiment, the controller 116 receives a synchronizing signal from the AC generator 108 indicating the start of each pulse interval. In another embodiment, the controller 116 receives sensor information from each sensor 114 configured in the power delivery path to detect the start of each new pulse interval. For example, controller 116 may determine that when a signal from a sensor 114 that measures a pulse amplitude increases or decreases, a new pulse is being generated by the AC generator 108. The controller 116 may use this information to determine the start of each new pulse interval in the multi-level pulse signal. In yet another embodiment, the controller 116 receives the synchronizing signal from an external pulse generator that is used for feeding the synchronizing signal to both the matching network and the power supply.

At step 506, the controller 116 obtains a configuration record 124 of the impedance matching network 110 for the current pulse interval. As discussed above, the configuration of the impedance matching network for the current pulse may have been determined when the same pulse type was used previously, and impedance measurements taken to assess any mismatch between impedances, and adjust the configuration settings to be used for the next pulse. For example, if the current pulse interval is the second of three total pulse intervals of the multi-level pulse signal, then the controller 116 may access the configuration record 124 was determined for the second pulse interval during a previous use of the second pulse interval. If no configuration record 124 for that pulse interval exists in the memory 118 of the controller (e.g., during initial startup), then the controller 116 may use a nominal baseline configuration to initiate the iterative sequence. The impedance of the plasma is measured in real-time using sensors configured in the matching network(s) and/or the RF generator(s). As discussed above, the sensors may be V/I sensors or directional couplers as examples. Nevertheless, embodiments of the present disclosure should not be limited by the choice, placement or type of sensor used for collecting impedance data. Either the matching network(s) and/or the RF generator(s) can be used as the master reference for matching. One particular approach is to centralize measurement and control, such as in the generator where measurements may be efficiently synchronized with pulse activity.

At step 508, the controller 116 sets the impedance matching network 110 according to the configuration record 124 stored for that pulse interval. Thereafter at step 510, the controller 116 determines an impedance mis-match level of the chamber according to excitation of the plasma 104 at the amplitude level specified for that pulse interval and the configuration of the impedance matching network 110. In one embodiment, the controller 116 may receive a measurement signal from one or more sensors 102 and determines the impedance mis-match level from the measured signal. For example, the sensor 114 may include a standing wave meter that measures forward and reflected power that can be used by the controller 116 to determine an impedance mis-match level. Complex impedance measurements provide both magnitude and phase angle of the mismatch.

At step 512, the controller 116 iteratively adjusts the configuration of the impedance matching network 110 to compensate for the impedance mis-match level. The controller 116 may adjust the configuration of the impedance matching network 110 in any suitable manner. In one embodiment, the controller 116 may adjust the configuration of the impedance matching network 110 by interpolating or extrapolating the measure impedance levels with a desired impedance level. In another embodiment, the controller 116 may adjust the configuration of the impedance matching network 110 by collecting and storing measured impedance levels for multiple cycles (e.g., duration) of each pulse interval and using a time averaging technique in which the controller 116 uses an average of the multiple previously measured impedance levels to adjust the configuration of the impedance matching network 110. Certain embodiments using a time averaging technique may provide an advantage in that averaging of multiple impedance levels may provide a smoother shift of impedance levels due to ever-changing conditions that may be incurred in the plasma chamber.

For example, if the controller 116 determines that a source impedance of the AC generator 108 is 50.0 Ohms and the load impedance of the terminal 112 is 70.0 Ohms, it may adjust the impedance matching network 110 so that the Thevenin equivalent impedance of the terminal 112 in conjunction with the impedance matching network 110 is at, or close to, 50.0 Ohms.

In one embodiment, the controller 116 may manipulate the switches 316 and 320 of the impedance matching network 300 shown in FIG. 3 according to the level and type of impedance mis-match detected from the sensors 114. For example, if the controller 116 determines that the measured impedance level is too low, it may manipulate the switches 320 of the series circuits 308 to compensate for the low impedance level, and conversely, if the controller 116 determines that the measured impedance level is too high, it may manipulate the switches 320 of the series circuits 308 to compensate for the high impedance level. Nevertheless, it should be appreciated that the impedance level may also be adjusted by simultaneously manipulating both the switches 320 of the series circuits 308 and the switches 316 of the shunt circuits 302. In a simplified example, if the controller 116 measures a value of 52 Ohms for the load impedance, and the source impedance of the AC generator is 50 Ohms, the controller may select a combination of shunt capacitors 316 that, when switched into the match network, are effectively coupled in parallel with the output 310, to cause the impedance seen at the input 314 to be 50 Ohms according to 2πfC, where f is the frequency of operation, and C is the combined capacitance of the shunt capacitors 314. In effect, the impedance matching circuit provides 2 Ohms impedance to match the source with the load. Further detail regarding impedance matching may be found in a white paper titled "Impedance Matching," published by Advanced Energy Industries (c) 1992, SL-WHITE18-270-01, available at www.advanced-energy.com, which is hereby incorporated by reference herein.

At step 514, the controller 116 stores the newly adjusted configuration of the impedance matching network 110 as a configuration record 124 in the memory to be used by the controller 116 for iteratively adjusting the impedance level for the current pulse interval when used at a future time. Thereafter, the controller 116 waits for the beginning of the next pulse duration of the multi-level pulse signal at step 516. That is, when the next pulse interval commences, processing continues at step 506 to process and iteratively adjust an impedance level for that next pulse interval.

The steps of steps 506 through 514 are repeated at ongoing intervals for each pulse interval to continually tailor the impedance level for each pulse interval generated by the AC generator 108. Nevertheless, when use of the impedance matching system 100 is no longer needed or desired, the process ends.

Although FIG. 5 describes one example of a process that may be performed by the controller 116 for continual adaptation of the effective impedance of the plasma chamber 102 for each pulse interval of the multi-level pulse signal, the features of the disclosed process may be embodied in other specific forms without deviating from the spirit and scope of the present disclosure. For example, the controller 116 may perform additional, fewer, or different operations than those operations as described in the present example. As another example, the steps of the process described herein may be performed by a controller external to the impedance matching system 100, which may be, for example, a single computing system that also controls the operation of some, most, or all of the AC generators 108 implemented on the plasma chamber 102.

Figure 6:
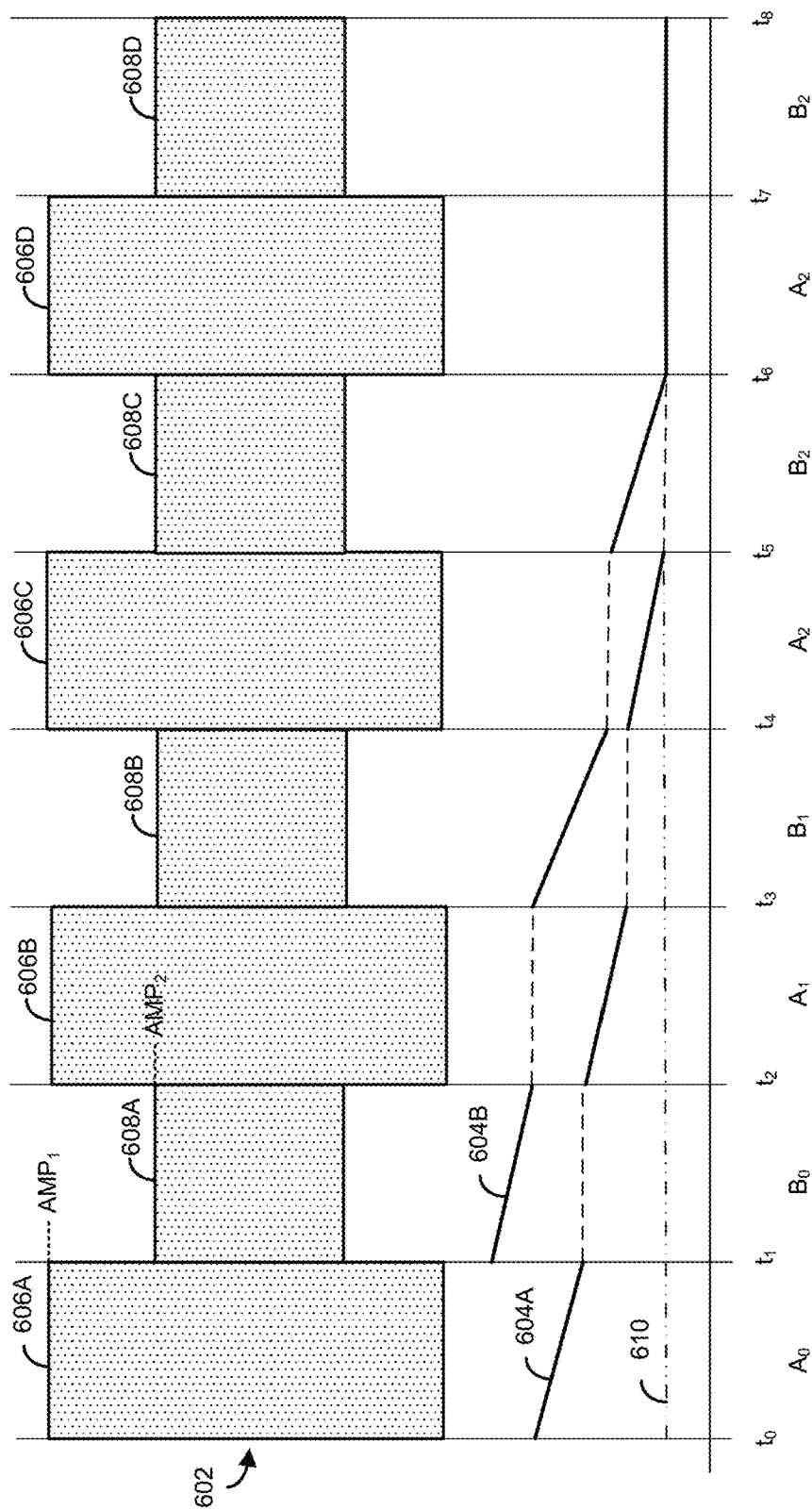
FIG. 6 illustrates an example multi-level pulse signal that may be generated by an impedance matching system and an associated impedance mismatch waveform resulting from the multi-level pulse signal being applied to the electrodes of a plasma chamber according to one embodiment of the present disclosure.

FIG. 6 illustrates an example multi-level pulse signal 602 that may be generated by the AC generator 108 and an associated impedance mismatch waveform 604 representing an impedance mis-match level resulting from the multi-level pulse signal being applied to the electrodes of a plasma chamber according to one embodiment of the present disclosure. As illustrated, the multi-level pulse signal 600 includes two cyclically recurring pulse intervals 606 and 608 with differing amplitudes AMP$_1$ and AMP$_2$, respectively.

Initially, at time t$_0$, the controller 116 controls the AC generator 108 to generate the pulse interval 606 at a first amplitude A$_0$. During the pulse interval 606, the controller 116 receives signals from the sensors 114, and determines an impedance mismatch level from the received signals. The impedance mis-match level generally refers to a difference in the source impedance of the AC generator 108 and a load impedance of the terminal 112. Graphically, the impedance mismatch is illustrated by the difference between the impedance mismatch waveforms 604A and 604B related to the mismatch for each respective pulse 606 and 608 as compared to a target impedance 610. The controller 116 selects a certain combination of shunt circuits 302 and series circuits 308 that are activated to reduce the level of impedance mismatch, and subsequently activates the selected shunt circuits 302 and/or series circuits 308. As a result, the impedance mismatch decreases as illustrated by the solid portion impedance mismatch waveform 604 during the first pulse interval 606A. The controller 116, in some implementations, may reduce the level of impedance mismatch according to a certain specified frequency response (e.g., loop frequency) characteristic prescribed for the plasma chamber. Thus, the controller 116 does not attempt to make the impedance mismatch go to 0.0 in one pulse interval; but rather adjusts the shunt circuits 302 and series circuits 308 to reduce the impedance mismatch according to a desired frequency response that maintains stability over certain conditions that may be incurred by the plasma chamber.

In a particular example, if the controller 116 determines that the AC generator 108 has a source impedance of 50 Ohms, while the terminal 112 has a load impedance of 60 Ohms, it may actuate one or more of the shunt circuits 302 to decrease the impedance of the combined load impedance and impedance matching network 110 as seen by the AC generator 108. Conversely, if the controller 116 determines that the AC generator 108 has a source impedance of 50 Ohms, while the terminal 112 has a load impedance of 40 Ohms, it may actuate one or more of the series circuits 302 to increase the impedance of the combined load impedance and impedance matching network 110 as seen by the AC generator 108. Additionally, the controller 116 stores information associated with the selected combination of shunt circuits 302 and series circuits 308 as a configuration record 124 (A$_0$) in the memory 118.

At time t$_1$, the controller 116 controls the AC generator 108 to generate the pulse interval 608A at the second amplitude AMP$_2$. This interval immediately follows the first interval 606A. During the pulse interval 608A, the controller 116 receives signals from the sensors 114, and determines an impedance mismatch level from the received signals. The controller 116 then selects a certain combination of shunt circuits 302 and series circuits 308 that may be activated to reduce the level of impedance mismatch, and subsequently activates the selected shunt circuits 302 and series circuits 308. As a result, the impedance mismatch decreases as illustrated by the solid line portion of the impedance mismatch waveform 608B during the pulse interval 608A. Additionally, the controller 116 stores information associated with the selected combination of shunt circuits 302 and series circuits 308 as a configuration record 124 (B$_0$) in the memory 118.

At time t$_2$, the controller 116 controls the AC generator 108 to generate the pulse interval 606B at the first amplitude AMP$_1$ (e.g., cyclically recurring pulse interval), such as performed by the controller 116 at step 502 of FIG. 5. During the pulse interval 606B, the controller 116 obtains an identity of the pulse interval 606 as described above with reference to step 504 of FIG. 5, obtains the configuration record 124 (A$_0$) that was stored back during the pulse interval 606A starting at time t$_0$ as described above with reference to step 506 of FIG. 5, and activates the combination of shunt circuits 302 and series circuits 308 using the information stored in the configuration record 124 (A$_0$). As can be seen, the impedance mismatch for pulse 608B begins at the ending level of the preceding pulse 606A of the same amplitude. The controller 116 then receives signals from the sensors 114, and determines an impedance mismatch level from the received signals as described above with reference to step 510 of FIG. 5. The controller 116 then selects a combination of shunt circuits 302 and series circuits 308 to reduce the level of impedance mismatch as described above with reference to step 512 of FIG. 5, and subsequently activates the selected shunt circuits 302 and series circuits 308. As a result, the impedance mismatch 604A is further decreased (represented by the solid line during pulse interval 608B).

The controller 116 then stores the newly adjusted configuration ($A_1$) as a configuration record in the memory as described above with reference to step 514 of FIG. 5, and waits for the beginning of the next pulse interval beginning at time $t_3$ as described above with reference to step 516 of FIG. 5.

At time $t_3$, the controller 116 controls the AC generator 108 to generate the pulse interval 608B at the second amplitude $AMP_2$ as described above with reference to step 502 of FIG. 5. During the second pulse interval 608B at the second amplitude $AMP_2$, the controller 116 obtains the configuration record 124 ($B_0$) that was stored during the pulse interval 608A starting at time $t_1$ as described above with reference to step 506 of FIG. 5, and activates the combination of shunt circuits 302 and series circuits 308 using the information stored in the configuration record 124 ($B_0$). As shown, the mismatch for the second pulse 608B begins at the level where the first pulse 608A ended. The controller 116 then receives signals from the sensors 114, and determines an impedance mismatch level from the received signals as described above with reference to step 510 of FIG. 5. The controller 116 then selects a iterative combination of shunt circuits 302 and series circuits 308 that may activated to further reduce the level of impedance mismatch, and subsequently activates the selected shunt circuits 302 and series circuits 308 as described above with reference to step 512 of FIG. 5. As a result, the impedance mismatch 604B, as shown by the solid line portion during the pulse 608B, is further decreased.

The controller 116 continually processes ensuing pulse intervals 606C, 606D and 608C, and 608D in a similar as described above to iteratively reduce the impedance mismatch between the AC generator 108 and the plasma chamber. As illustrated both mismatch levels approach the target level 610, where a match is graphically depicted when the mismatch 604A or 604B aligns with the target 610. In the example depicted in FIG. 6, a match for the pulses of amplitude one (606A, 606B, etc.) occurs at time $t_5$ whereas a match for the amplitude two pulses (608A, 608B, etc.) occurs at time $t_6$. The configuration records $A_2$ and $B_2$, for the respective pulses 606 and 608, are used during subsequent intervals of each pulse as the associated match circuit configurations are associated with a match condition. The period where iterative matches are occurring during each pulse is considered active tuning, whereas the period after is considered maintaining the match condition.

Although a multi-level pulse signal having two cyclically recurring pulse intervals are shown and described, it should be understood that embodiments of the present disclosure may be applied to other multi-level pulse signals having more than two recurring pulse intervals. That is, the controller 116 may be used to reduce the mismatch impedance for an multi-level pulse signal having any quantity of cyclically recurring pulse intervals without departing from the spirit and scope of the present disclosure. Active tuning may occur for various possible numbers of cycles until a match condition occurs. Match maintaining may be monitored and active tuning may reoccur should a mismatch develop.

The description above includes example systems, methods, techniques, instruction sequences, and/or computer program products that embody techniques of the present disclosure. However, it is understood that the described disclosure may be practiced without these specific details.

In the present disclosure, the methods disclosed may be implemented as sets of instructions or software readable by a device. Further, it is understood that the specific order or hierarchy of steps in the methods disclosed are instances of example approaches. Based upon design preferences, it is understood that the specific order or hierarchy of steps in the method can be rearranged while remaining within the disclosed subject matter. The accompanying method claims present elements of the various steps in a sample order, and are not necessarily meant to be limited to the specific order or hierarchy presented.

The described disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form (e.g., software, processing application) readable by a machine (e.g., a computer). The machine-readable medium may include, but is not limited to, magnetic storage medium (e.g., hard disk drive), optical storage medium (e.g., CD-ROM); magneto-optical storage medium, read only memory (ROM); random access memory (RAM); erasable programmable memory (e.g., EPROM and EEPROM); flash memory; or other types of medium suitable for storing electronic instructions.

Figure 7:
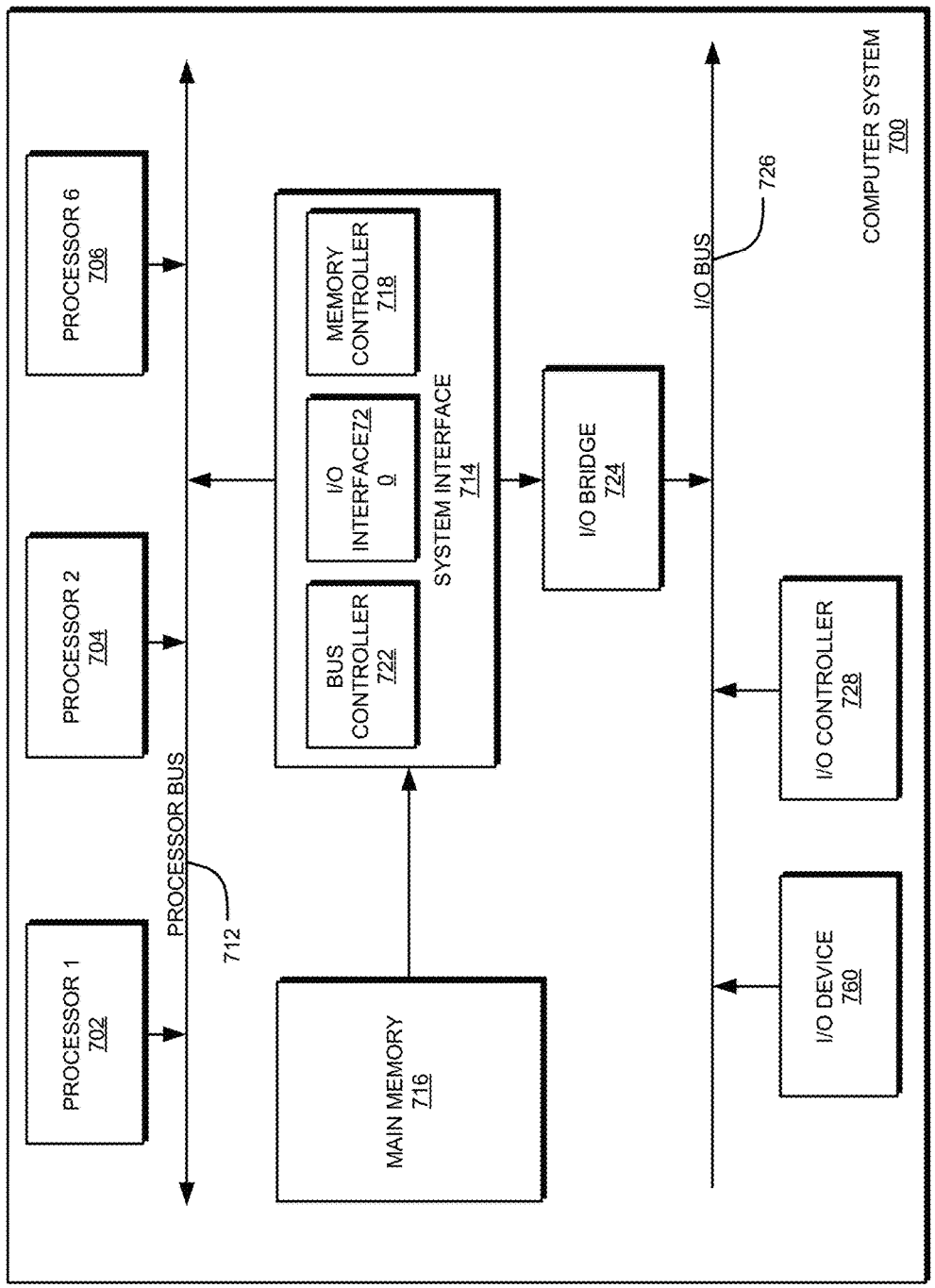
FIG. 7 illustrates an example computer system according to one embodiment of the present disclosure.

For example, FIG. 7 is a block diagram illustrating an example of a host or computer system 700 which may be used in implementing the embodiments of the present disclosure, such as the controller 116 as shown in FIG. 3B. The computer system (system) includes one or more processors 702-706. Processors 702-706 may include one or more internal levels of cache (not shown) and a bus controller or bus interface unit to direct interaction with the processor bus 712. Processor bus 712, also known as the host bus or the front side bus, may be used to couple the processors 702-706 with the system interface 714. System interface 714 may be connected to the processor bus 712 to interface other components of the system 700 with the processor bus 712. For example, system interface 714 may include a memory controller 713 for interfacing a main memory 716 with the processor bus 712. The main memory 616 typically includes one or more memory cards and a control circuit (not shown). System interface 714 may also include an input/output (I/O) interface 720 to interface one or more I/O bridges or I/O devices with the processor bus 712. One or more I/O controllers and/or I/O devices may be connected with the I/O bus 626, such as I/O controller 728 and I/O device 730, as illustrated.

I/O device 730 may also include an input device (not shown), such as an alphanumeric input device, including alphanumeric and other keys for communicating information and/or command selections to the processors 702-706. Another type of user input device includes cursor control, such as a mouse, a trackball, or cursor direction keys for communicating direction information and command selections to the processors 702-706 and for controlling cursor movement on the display device.

System 700 may include a dynamic storage device, referred to as main memory 716, or a random access memory (RAM) or other computer-readable devices coupled to the processor bus 712 for storing information and instructions to be executed by the processors 702-706. Main memory 716 also may be used for storing temporary variables or other intermediate information during execution of instructions by the processors 702-706. System 700 may include a read only memory (ROM) and/or other static storage device coupled to the processor bus 712 for storing static information and instructions for the processors 702-706. The system set forth in FIG. 7 is but one possible example of a computer system that may employ or be configured in accordance with aspects of the present disclosure.

According to one embodiment, the above techniques may be performed by computer system 700 in response to processor 704 executing one or more sequences of one or more instructions contained in main memory 716. These instructions may be read into main memory 716 from another machine-readable medium, such as a storage device. Execution of the sequences of instructions contained in main memory 716 may cause processors 702-706 to perform the process steps described herein. In alternative embodiments, circuitry may be used in place of or in combination with the software instructions. Thus, embodiments of the present disclosure may include both hardware and software components.

A computer readable medium includes any mechanism for storing or transmitting information in a form (e.g., software, processing application) readable by a machine (e.g., a computer). Such media may take the form of, but is not limited to, non-volatile media and volatile media. Non-volatile media includes optical or magnetic disks. Volatile media includes dynamic memory, such as main memory 716. Common forms of machine-readable medium may include, but is not limited to, magnetic storage medium (e.g., hard disk drive); optical storage medium (e.g., CD-ROM); magneto-optical storage medium; read only memory (ROM); random access memory (RAM); erasable programmable memory (e.g., EPROM and EEPROM); flash memory; or other types of medium suitable for storing electronic instructions.

Embodiments of the present disclosure include various operations or steps, which are described in this specification. The steps may be performed by hardware components or may be embodied in machine-executable instructions, which may be used to cause a general-purpose or special-purpose processor programmed with the instructions to perform the steps. Alternatively, the steps may be performed by a combination of hardware, software and/or firmware.

It is believed that the present disclosure and many of its attendant advantages will be understood by the foregoing description, and it will be apparent that various changes may be made in the form, construction, and arrangement of the components without departing from the disclosed subject matter or without sacrificing all of its material advantages. The form described is merely explanatory, and it is the intention of the following claims to encompass and include such changes.

While the present disclosure has been described with reference to various embodiments, it will be understood that these embodiments are illustrative and that the scope of the disclosure is not limited to them. Many variations, modifications, additions, and improvements are possible. More generally, embodiments in accordance with the present disclosure have been described in the context of particular implementations. Functionality may be separated or combined in blocks differently in various embodiments of the disclosure or described with different terminology. These and other variations, modifications, additions, and improvements may fall within the scope of the disclosure as defined in the claims that follow.

What is claimed is:

1. An impedance matching system comprising:
   an impedance matching network coupled between an alternating current (AC) generator and one or more electrodes of a plasma chamber, the AC generator configured to generate a multi-level pulse signal comprising a plurality of cyclically recurring pulse intervals with differing amplitude levels; and
   a controller comprising instructions stored in at least one memory and executed by at least one processor to:
     identify each of the plurality of cyclically recurring pulse intervals;
     for each of the plurality of cyclically recurring pulse intervals:
       determine an impedance mis-match level between the AC generator and a plasma load being generated in the plasma chamber at the one or more electrodes;
       adjust a configuration of the impedance matching network according to the determined impedance mis-match level;
       store information associated with the adjusted configuration in the at least one memory; and
       when an ensuing pulse interval occurs:
         obtain the stored information from the at least one memory;
         adjust the configuration of the impedance matching network according to the stored information.

2. The impedance matching system of claim 1, wherein the configuration defines a combination of one or more elements of the impedance matching network that are selectively activated to adjust an impedance of the impedance matching network to reduce the impedance mis-match level between the AC generator and the plasma load.

3. The impedance matching system of claim 2, wherein the controller is further executed to:
   activate one or more shunt circuits to adjust a first capacitive coupling of an input of the impedance matching network to a ground node, the one or more shunt circuits coupled between the input of the impedance matching network and the ground node, each shunt circuit comprising a shunt capacitor coupled in series with a shunt switch configured to be turned on and off; and
   activate one or more series circuits to adjust a second capacitive coupling of the input of the impedance matching network to an output node, the one or more series circuits coupled between the input and the output node of the impedance matching network, each series circuit comprising at least one series capacitor coupled in series with a series switch configured to be turned on and off.

4. The impedance matching system of claim 3, wherein each of the shunt switch and the series switch comprises a positive intrinsic negative (PIN) diode.

5. The impedance matching system of claim 1, wherein the controller is further executed to:
   average a plurality of the configurations for a plurality of previous pulse intervals; and
   adjust the configuration of the impedance matching network according to the average of the plurality of the configurations.

6. The impedance matching system of claim 1, wherein the AC generator comprises at least one of a radio frequency (RF) generator, a mid frequency (MF) generator, a high frequency (HF) generator, or a very high frequency (VHF) generator.

7. The impedance matching system of claim 1, wherein the controller is further executed to:
identify each of the plurality of cyclically recurring pulse intervals by receiving a synchronization signal from the AC generator, the synchronization signal comprising pulses indicating a start of each pulse interval.

8. The impedance matching system of claim 1, wherein the controller is further executed to:
identify each of the plurality of cyclically recurring pulse intervals according to ongoing measured energy values obtained from one or more sensors configured in power delivery path.

9. An impedance matching method comprising:
identifying, by at least one processor that executes instructions stored in at least one memory, each of a plurality of recurring pulse intervals of a multi-level pulse signal generated by an alternating current (AC) generator; and
for each of the plurality of recurring pulse intervals:
obtaining, using the instructions executed by the at least one processor, from the at least one memory, a configuration of one or more elements of an impedance matching network used to match an impedance of the recurring pulse interval during a previous pulse interval, the impedance matching network coupled between the AC generator and an electrode of a plasma chamber;
setting, using the instructions executed by the at least one processor, the one or more elements of the impedance matching network according to the obtained configuration of the one or more elements;
activating one or more shunt circuits to adjust a first capacitive coupling of an input of the impedance matching network to a ground node, the one or more elements comprising the one or more shunt circuits coupled between the input of the impedance matching network and the ground node in which each of the one or more shunt circuits comprises a shunt capacitor coupled in series with a shunt positive intrinsic negative (PIN) diode; and
activating one or more series circuits to adjust a second capacitive coupling of the input of the impedance matching network to an output node, the one or more series circuits coupled between the input of the impedance matching network and the output node in which each of the one or more series circuits comprises at least one series capacitor coupled in series with a series PIN diode.

10. The impedance matching method of claim 9, further comprising:
measuring an impedance mis-match level due to excitation of the electrode at the set configuration of the one or more elements of the impedance matching network; and
iteratively adjusting the configuration of the one or more elements of the impedance matching network to further reduce the impedance mis-match level.

11. The impedance matching method of claim 9, further comprising:
averaging a plurality of the configurations for a plurality of previous pulse intervals; and
adjusting the configuration of the impedance matching network according to the average of the plurality of the configurations.

12. The impedance matching method of claim 9, further comprising:
receiving a synchronization signal from the AC generator to identify each of the plurality of cyclically recurring pulse intervals.

13. The impedance matching method of claim 9, further comprising:
determining a start of each pulse interval according to measured values obtained from one or more sensors configured in a power delivery path to identify each of the plurality of cyclically recurring pulse intervals.

14. A plasma chamber comprising:
an enclosure configured with a plurality of electrodes;
an alternating current (AC) generator;
a matching network coupled between the AC generator and one or more electrodes of the plasma chamber, the AC generator configured to generate a multi-level pulse signal comprising a plurality of cyclically recurring pulse intervals with differing amplitude levels; and
a controller comprising instructions stored in at least one memory and executed by at least one processor to:
identify each of the plurality of cyclically recurring pulse intervals;
for each of the plurality of cyclically recurring pulse intervals:
determine an impedance mis-match level between the AC generator and the one or more electrodes;
adjust a configuration of an impedance matching network according to the determined impedance mis-match level;
store information associated with the adjusted configuration in the at least one memory; and
when an ensuing pulse interval occurs:
obtain the stored information from the at least one memory;
adjust the configuration of the impedance matching network according to the stored information.

15. The plasma chamber of claim 14, wherein the configuration comprises a combination of one or more elements of the impedance matching network that are selectively turned off and on to adjust an impedance mismatch between the AC generator and the plurality of electrodes.

16. The plasma chamber of claim 15, wherein the controller is further executed to:
activate one or more shunt circuits to adjust a first capacitive coupling of an input of the impedance matching network to a ground node, the one or more a shunt circuits coupled between the input of the impedance matching network and the ground node, each shunt circuit comprising a shunt capacitor coupled in series with a shunt switch; and
activate one or more series circuits to adjust a second capacitive coupling of an input of the impedance matching network to an output node, the one or more series circuits coupled between the input and an output of the impedance matching network, each series circuit comprising at least one series capacitor coupled in series with a series switch.

17. The plasma chamber of claim 14, wherein the controller is further executed to:
average a plurality of the configurations for a plurality of previous pulse intervals; and
adjust the configuration of the impedance matching network according to the average of the plurality of the configurations.

18. The plasma chamber of claim 14, wherein the controller is further executed to:
    identify each of the plurality of cyclically recurring pulse intervals by receiving a synchronization signal from the AC generator, the synchronization signal comprising pulses indicating a start of each of the plurality of cyclically recurring pulse intervals.

\* \* \* \* \*